United States Patent [19]

Soma et al.

[11] Patent Number: 4,523,289
[45] Date of Patent: Jun. 11, 1985

[54] TIME INTERVAL MEASURING SYSTEM

[75] Inventors: Masafumi Soma, Fussa; Yoshihiko Kohno, Kokubunji, both of Japan

[73] Assignee: Iwasaki Tsushinki Kabushiki Kaisha, Tokyo, Japan

[21] Appl. No.: 458,469

[22] Filed: Jan. 17, 1983

Related U.S. Application Data

[63] Continuation-in-part of Ser. No. 217,463, Dec. 17, 1980, abandoned.

[30] Foreign Application Priority Data

Dec. 27, 1979 [JP] Japan .................................. 54-169456

[51] Int. Cl.³ ............................................ G01R 23/02
[52] U.S. Cl. ....................................... 364/569; 377/20
[58] Field of Search ........................ 364/569, 900, 200; 377/19, 20; 368/155

[56] References Cited

U.S. PATENT DOCUMENTS 4,041,288  8/1977  Conway et al. ............... 324/99 R X
4,165,459  8/1979  Curtice ........................... 364/569 X
4,176,337  11/1979 Aechter et al. .................. 364/569 X
4,192,130  3/1980  Takeuchi ......................... 364/569 X
4,216,463  8/1980  Backof, Jr. et al. ........... 324/78 D X

OTHER PUBLICATIONS

High-Speed Device for Time Interval Measurement; Kovrigin et al; Plenum Publishing Corp., 1979, pp. 484-486.
Programmable Event Time, Stehens, IBM Technical Disclosure Bulletin, vol. 22, No. 2, Jul. 1979, pp. 785-786.

Primary Examiner—Edward J. Wise
Attorney, Agent, or Firm—Robert E. Burns; Emmanuel J. Lobato; Bruce L. Adams

[57] ABSTRACT

A time interval measuring system, which is proposed for measuring in a digital memory, etc. a time interval between two time points meeting with measurement conditions indicative of two kinds of optionally presettable threshold levels, polarities and the numbers of slopes in a digital value train converted from an analog signal.

4 Claims, 6 Drawing Figures

TIME INTERVAL MEASURING SYSTEM

CROSS-REFERENCE TOO RELATED APPLICATION

This application is a continuation-in-part of our co-pending application of Ser. No. 217,463 filed on Dec. 17, 1980 and now abandoned.

FIELD OF THE INVENTION

The present invention relates to a system for measuring the time interval between two time points in a digital signal train into which an analog signal is converted by an A/D converter after being sampled by clock pulses of equal time intervals.

BACKGROUND OF THE INVENTION

One conventional system of the type is a system that employs an electronic counter in which a time interval between two time points on an analog input signal is measured on the real time basis, using an analog comparator; but this prior art system has a defect such that it is difficult to measure the time interval in a case where the input signal has a complex waveform. In the device of the type having an A/D converter and a memory, such as a digitizer, measurements of time intervals are not performed by specifying a trigger level, a slope and so forth.

In such a device as a digitizer, a digital sampling oscilloscope, a digital storage oscilloscope, a transient-scope, etc., an analog input signal is converted at certain equal time intervals by an A-D converter to a digital value train and the converted signal waveforms are stored in a memory. Not only in the abovesaid device but also in means for analyzing the signal waveform once converted into a digital value, the measurement of the time interval in the signal is also an important item of analysis along with a frequency analysis, such as Fourier transformation, or voltage measurement. There is a method of measuring the time interval in the analog input signal after the signal converted to the digital value train is recoverted by a D/A converter to the original analog signal. However, this method requires a D/A converter also for digital setting of a trigger level, adjustment of an analog processing circuit added and countermeasures against external disturbances such as noise, temperature and so forth; accordingly, this method is defective in that the arrangement used is complex. Further, the addition of an electric counter or the like to the abovesaid device also results in the drawback of a complicated arrangement.

It is also possible to read out and process successively a stored digital signal train by software processing under the control of a control unit such as a microprocessor, a minicomputer or the like; but this is time-consuming.

SUMMARY OF THE INVENTION

An object of the present invention is to provide a time interval measuring system which is capable of measuring, at a high speed, the time intervals in a digital signal train sampled at equal time intervals and which can be constituted entirely by digital circuits.

BRIEF DESCRIPTION OF THE ACCOMPANYING DRAWINGS

The principle, construction and operation of the invention will be clearly understood from the following detailed description taken in conjunction with the accompanying drawings, in which.

DETAILED DESCRIPTION OF THE INVENTION

Figure 1:
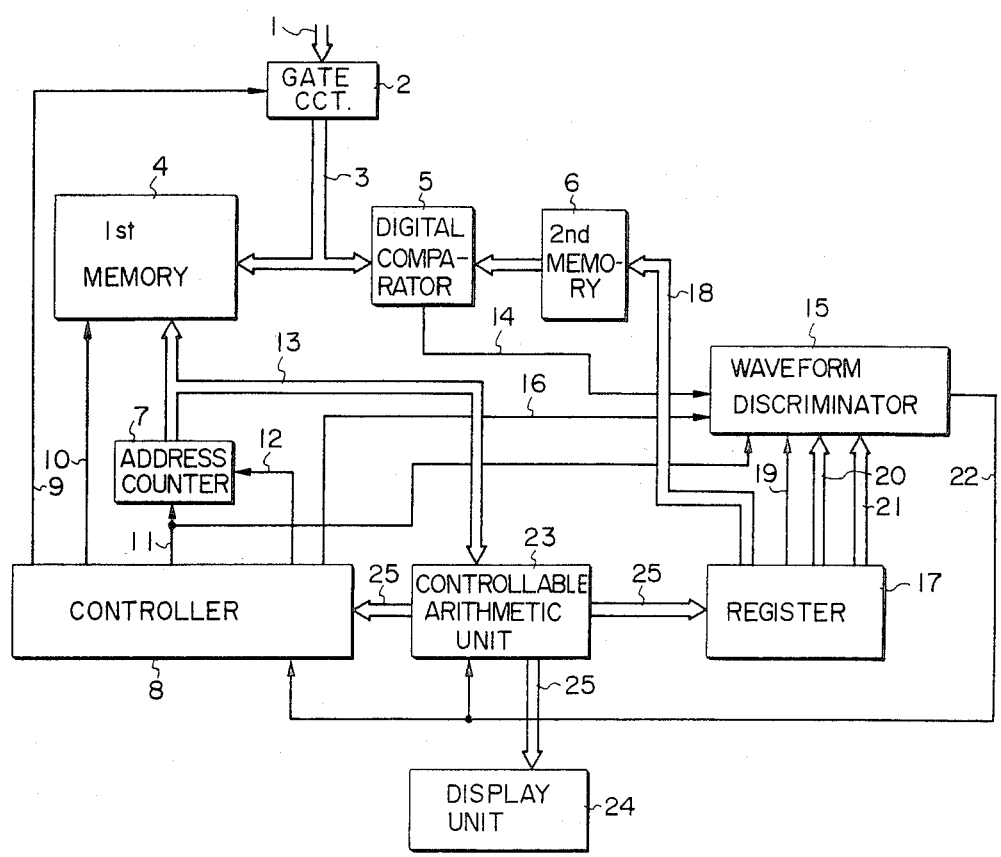
FIG. 1 is a block diagram showing an embodiment of the present invention.
Figure 2:
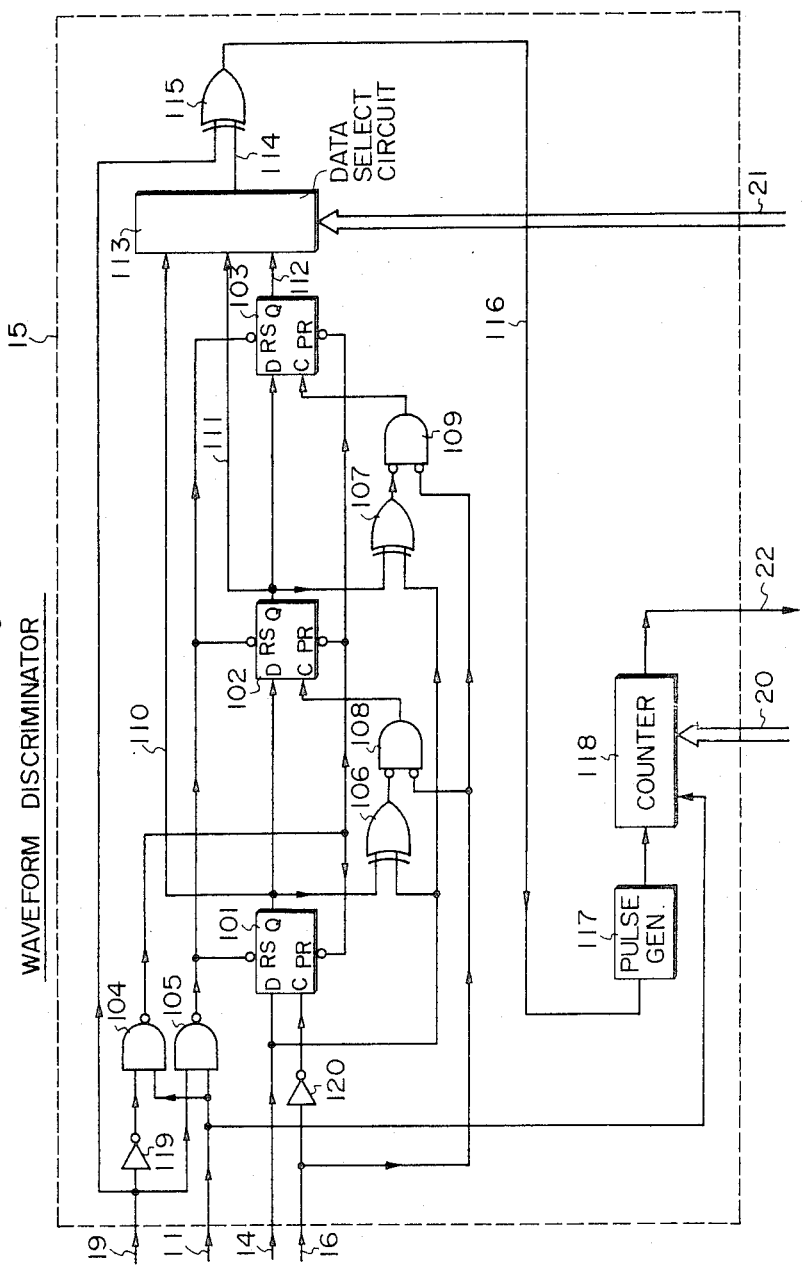
FIG. 2 is a block diagram illustrating a specific example of a waveform discriminator for use in the present invention.

With reference to FIG. 1 showing an embodiment of the present invention, reference numeral 1 indicates an input data bus into which is applied a 10-bit data train converted to digital form in an external circuit; 2 designates a 10-bit input gate circuit for gating data on the input data bus 1; 3 identifies a 10-bit, bi-directional data bus which is connected to the output of the gate circuit 2, a first memory 4 and a digital comparator 5, and through which time-divisional data flow changes from the input gate circuit 2 to the first memory 4 during the writing-in mode and from the first memory 4 to the digital comparator means 5 during the reading-out mode; 4 denotes a first memory which is constituted by a 10-bit, 1024-word random access memory in which the 10-bit data train from the input data bus 1 is sequentially stored in a series of memory addresses and from which the stored contents can be read out; 5 represents a 10-bit digital comparator which makes a comparison operation between a data train sequentially read out from the first memory 4 and a threshold value stored in a second memory 6 described later and produces a discrimination signal; 6 shows a second memory which is formed by a 10-bit register for storing the threshold value to be compared with the data from the first memory 4 in the digital comparator 5; 7 refers to a 10-bit address counter for indicating the storage position of the 10-bit data to be stored or having been stored in the first memory 4; 8 indicates a controller having several control lines for controlling the reading mode and the writing mode of the first memory 4 by control signals for designating the writing mode and the reading mode in the first memory 4, and for generating clock pulses to count-up the addresses of the address counter 7 and other signals; 9 designates an input gate control signal for opening the gate circuit 2 in a case of writing the data of the input data bus 1 in the first memory 4; 10 identifies read/write control signals for the first memory 4; 11 denotes a preset signal for presetting the counter 7 to the state "0" in a case of the reading mode or the writing mode; 12 represents clock pulses which are derived from the controller 8 for counting-up the count value of the counter 7 one by one; 13 shows a 10-bit output signal from the address counter 7; 14 refers to a output signal from the digital comparator means 5; 15 indicates a waveform discriminator, a specific circuit arrangement of which is illustrated in FIG. 2; 16 designates clock pulses for waveform discrimination which are applied from the controller 8 to the waveform discriminator 15 in synchronism with the clock pulses 12; 17 identifies a register (e.g. a plurality of 8255A INTEL CO.) for setting up conditions of waveform discrimination, that is, measurement conditions, in the second memory 6 and the waveform discriminator 15; 18 denotes a 10bit data bus for setting up the threshold value in the second memory 6; 19 represents a polarity (slope) set signal for setting up the polarity (slope) (+ or −) when the data read out from the first memory 4 crosses the abovesaid threshold value during the waveform discrimination operation; 20 shows a signal for setting up the number of times by which a series of values read out from the first memory 4 crosses the abovementioned threshold value in the polarity specified by the abovesaid polarity set signal 19; 21 refers to a resolution set signal (e.g. two-bits) for specifying the resolution of discrimination during the waveform discrimination operation by the waveform discriminator 15; 22 indicates a coincidence signal which is derived from the waveform discriminator 15 when the stored data read out from the first memory 4 coincides with the data of the threshold value, the polarity and the number of times of polarity mentioned above; 23 designates a controllable arithmetic unit, such as microprocessor, which has functions of controlling the entire sequence and reading out the output from the counter 7 to perform a time-measuring operation and to apply the operation result to a display unit 24 during the discrimination; 24 identifies a display unit for displaying time data or the like and comprising ICL 7218A of INTERSIL CO. and light emitting diodes, by way of example; and 25 denotes common control buses for connecting the controllable arithmetic unit 23 to the control means 8 and the register 17.

FIG. 2 illustrates an example of the waveform discriminator 15. Reference numerals 101, 102 and 103 indicate cascade-connected D-type flip-flops; 104 and 105 designate two-input NAND gates for for setting the outputs from the flip-flops 101, 102 and 103 by the preset signal 11 in the polarity determined by the polarity set signal 19 during the initial setting; 106 and 107 identify two-input exclusive OR gates; 108 and 109 denote negative-input AND gates; 110 represents an output signal from the flip-flop 101; 111 shows an output signal from the flip-flop 102; 112 refers to an output signal from the flip-flop 103; 113 indicates a data select circuit which selects one of the signals 110, 111 and 112 by the resolution set signal 21 and generates a selected signal; 114 designates one of the signals 110, 111 and 113 which is selected by the data select circuit 113; 115 identifies a two-input exclusive OR gate for controlling the logic polarity of the signal 114 by the signal 19; 116 denotes a signal polarity-converted by the exclusive OR gate 115; 117 represents a pulse generator which generates a pulse at each positive edge of the signal 116; 118 shows a counter (e.g. a scale of 16 counter) which generates the signal 22 when the value of the signal 20 initially set by the preset signal 11 is counted down by one to "0" for each negative edge of the abovesaid pulses from the pulse generator 117; and 119 and 120 refer to logical inverters.

In the digitizer device or the like, an analog input signal is converted into a digital signal at constant time intervals. The system of the present invention is one in which, in such a device, the time in a converted digital signal train or a digital train already converted-and-stored in a memory is measured by setting up two kinds (a start point condition and a stop point condition) of measurement conditions (or waveform discriminating conditions) represented by the aforementioned threshold value, the polarity and the number of times of the polarity, which can be freely set, by finding out sample points of the digital signal train which coincide with the abovesaid conditions and by detecting a difference between addresses of start and stop points thus found out.

A description will be given, for example, in connection with a case of measuring the time interval between the rise and fall of a signal crossing a certain voltage.

Figure 3:
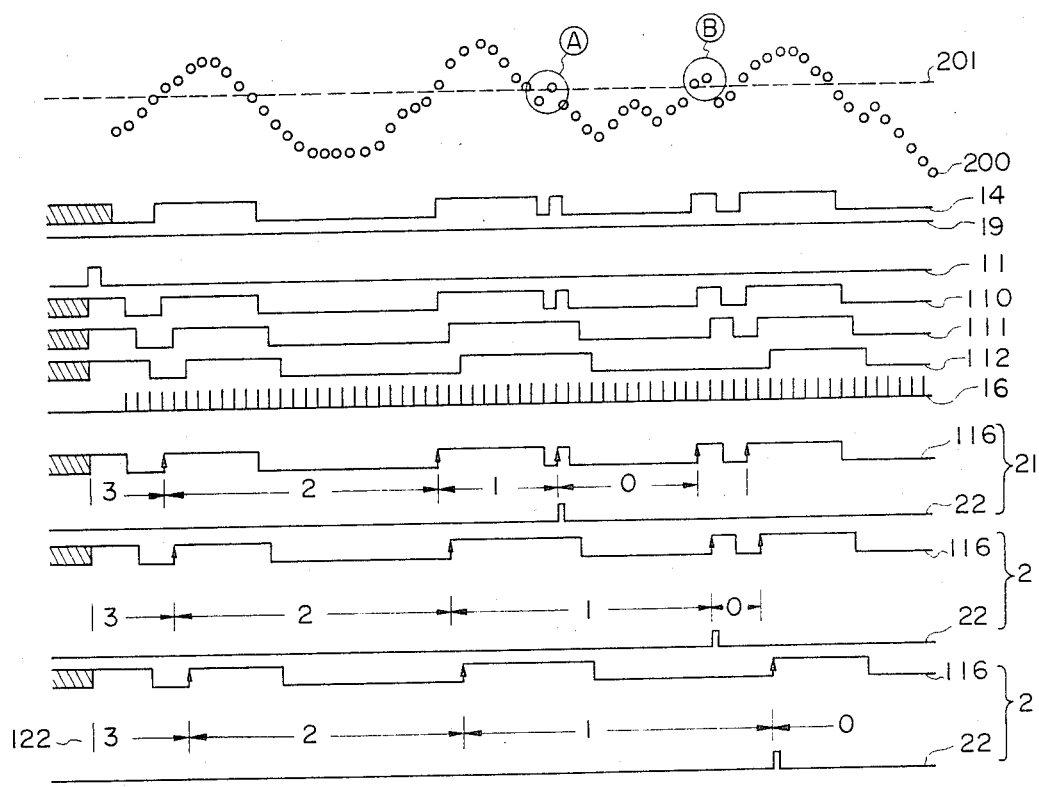
FIG. 3 is a timing chart explanatory of the operation of the specific example shown in FIG. 2.

At first, 10-bit digital values sampled at a constant period T are provided in the order of sampling from the input data bus 1 via the input gate circuit 2 and the data bus 3 to the first memory 4, and stored in addresses indicated by the 10-bit value of the signal 10 under the control of the controller 8. In this case, the data train on the data bus 1 may also be data already converted and stored in an external memory, or data converted immediately before being stored in the memory under the control of the controller 8. In the case of the latter, the first memory 4 also serves as a waveform memory. The data are stored in the memory 4 continuously while the output from the counter 7 varies from "0" to a value "1023". Now, let it be assumed that such a digital signal train as indicated by 200 in FIG. 3 is stored in the first memory 4. After completion of the storing, the input gate circuit 2 is closed by the signal 9 to establish the output from the input gate circuit 2 in its high impedance state. The time interval measurement for the stored data train is performed, in this embodiment, by two readout operations of the first memory 4, that is, one for determining the start point and the other for determining the stop point.

Before reading out contents of the memory 4 for determining the start point, a threshold value is transfered to the second memory 6 from the register 17. Further, if the signal 19 is set to the logic "0" and the polarity +, if the number of times of polarity is set by the signal 20, for example, to "3" and if the resolution is set by the signal 21 to "3", the sample point of a third rise-up portion crossing the threshold value is obtained by the start point condition. By the preset signal 11 from the control means 8, the counter 7 is set to the state "0" and the waveform discriminator 15 is initialized. In FIG. 3, reference numeral 201 indicates a set threshold value. By the preset signal 11 and the polarity set signal, the outputs 110, 111 and 120 from the flip flops 101, 102 and 103 are set to the logic "1". The count value of the counter 7 is counted up by the clock pulses 12 one by one and, at the same time, the data stored in the first memory 4 is read out by the control signal 10 onto the data bus 3 and, in synchronism with the read-out timing, the discrimination clock pulses 16 are applied to the waveform discriminator 15. The data on the data bus 3 and the output from the second memory 6, that is, the threshold value are compared with each other so that the comparison result 14 is provided to the waveform discriminator 15. In a series of read-out operations the outputs from the flip-flops 101, 102 and 103 become such as indicated by 110, 111 and 112 in FIG. 3. The output 112 from the flip-flop 103 is a magnitude discriminated signal having removed therefrom portions A and B in FIG. 3. The signal 111 is a magnitude discriminated signal having removed therefrom the portion B. In a case of the resolution set signal being "3", the count value of a polarity counter 118 varies as indicated by 122 and the coincidence signal 22 is provided when its value becomes the state "0". By the coincidence signal 22 the controller 8 is stopped from producing the clock pulses 12 and, at the same time, the controllable arithmetic unit 23 reads out a value Ns stored in the counter 7 at that time. In FIG. 3, the portion A is a slight change of one-count width crossing a threshold value 201 and the portion B a slight change of two-count width. As will be seem from FIG. 3, a waveform discrimination can be achieved without counting such slight variations in the vicinity of the threshold value, using them as the number of times of polarity.

Generally, in an analog circuit, it is possible that a comparator itself is equipped with a voltage hysteresis characteristic so as to eliminate the abovementioned slight variations, but it is difficult for a comparator in a digital circuit to have the hysteresis characteristic. The waveform discriminator utilized in the present invention is equipped with the function of a kind of time interval filter by the resolution specify signal 21, thereby to eliminate the aforesaid slight variations.

After reading out contents of the memory for determining the start point, conditions for determining the stop point, that is, the threshold value, the polarity and the number of times of polarity are specified, as is the case with the start point, before reading out contents of the memory for determining the stop point. As in the case of reading out contents of the memory for determining the start point, the counter 7 is reset by the preset signal 11 and the supply of the clock pulses 12 to the counter 7 is continued until the coincidence signal 22 is derived from the waveform discriminator 15. Upon yielding the coincidence signal, the supply of the clock pulses 12 is stopped and a value Np in the counter 7 is read out by the controllable arithmetic unit 23. From the abovesaid values Ns and Np and the clock pulse period T, the time interval between the start point and the stop point is obtained by $(N_p - N_s) \times T$. This arithmetic operation is conducted by the controllable arithmetic unit 23, the output from which is applied to as a measured time value to the display unit 24 for display thereon. By preselecting the resolution specify signal 21 in accordance with the state of the input signal, it is possible to roughly measure the variation time of the input signal even if it has a complex waveform. Further, the time interval between two signals can easily be measured by using two channels for the first memory 4 and selecting one of them for reading out the memory.

Figure 4:
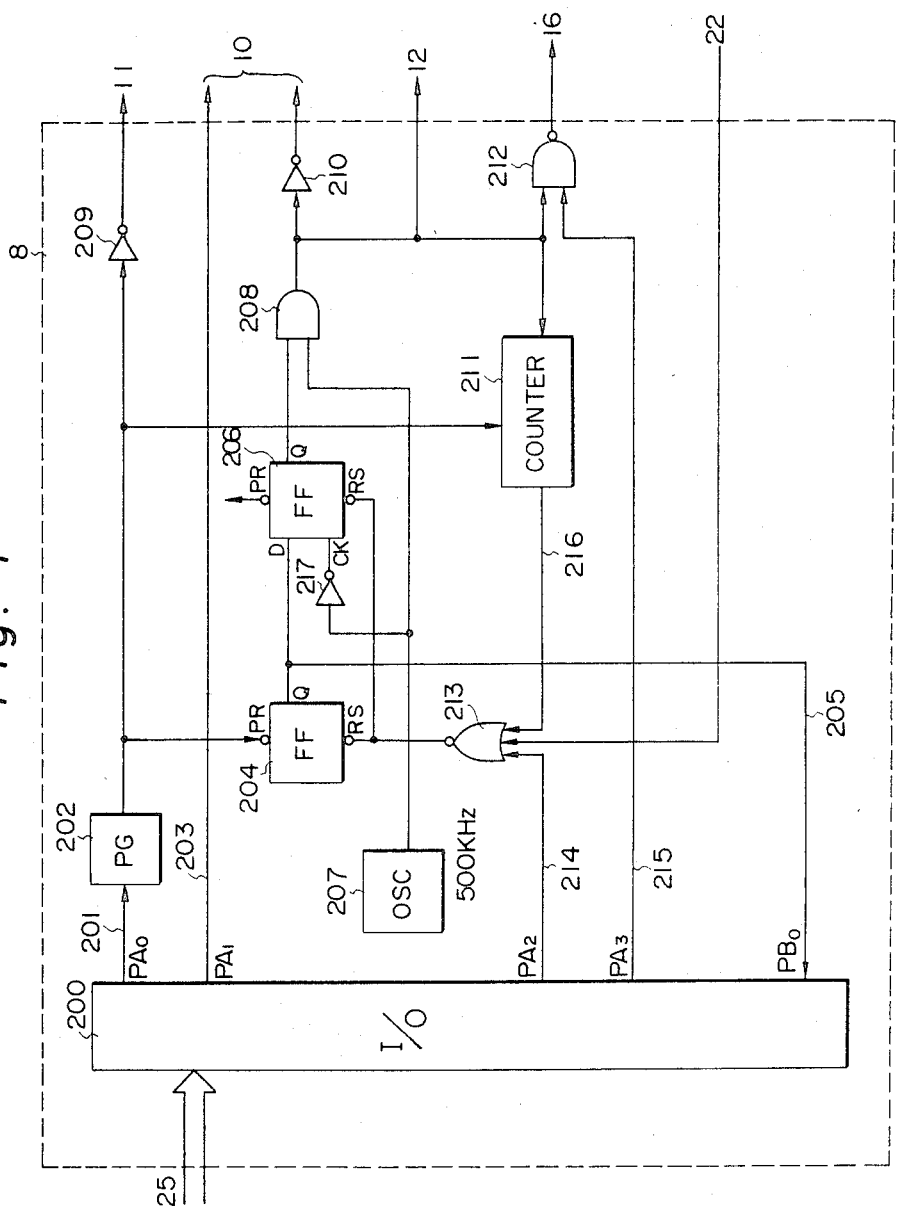
FIG. 4 is a block diagram illustrating an example of a controller employed in the embodiment shown in FIG. 1.

With reference to FIG. 4, an example of the controller 8 will be described.

In FIG. 4, 200 indicates an I/O device (e.g. IC8255A of INTEL Co.) connected to the common control buses 25; 201, 203, 214 and 215 identify the outputs $PA_0$, $PA_1$, $PA_2$ and $PA_3$ of the I/O device 200, respectively, the logic levels of the outputs $PA_0$, $PA_1$, $PA_2$ and $PA_3$ being controlled by the controllable arithmetic unit 23 through the common control buses 25; 202 designates a pulse generator; 209, 210 and 217 indicates logical inverters; 204 denotes a R-S typed flip-flop; 205 refers to the output of the flip-flop 204 connected to the input $PB_0$ of the I/O device 200 to indicate by its logic level the reading mode or the writing mode of the first memory 4; 206 represents a D-typed flip-flop; 207 shows an oscillator of 500 kilo-Hz; 208 indicates a NAND gate; 211 identifies a scale-of-1024 counter for generating a carry pulse 216 by counting 1024 clock pulses 12; 212 designates a NAND gate; and 213 refers to a NOR gate having three inputs.

Figure 5:
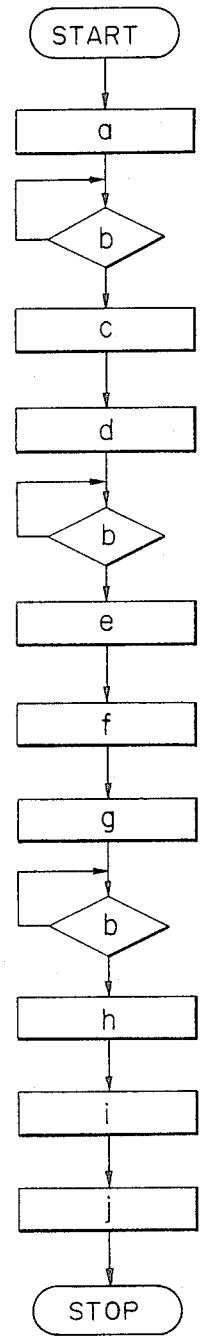
FIG. 5 is a flow chart explanatory of the operation an arithmetic unit employed in the embodiment shown in FIG. 1.

In case of forming the controllable arithmetic unit 23 by a micro computer, the operation sequence is shown in FIG. 5.

(a) 1024 data sampled at intervals T in an external device are stored in the first memory 4.

(b) The completition of the above operation (a) is waited for. More particularly described, it is monitored that the output of the flip-flop 204 is changed from the state "1" to the state "0".

(c) The condition for determining the starting points, that is, data 18, 19, 20 and 21 are stored in the register 7 and the second memory 6.

(d) The operation mode of the first memory 4 is changed to the reading mode, and successive reading of 1024 data at maximum is instructed to determine the starting point.

(e) The data of the counter 7 are read out as a value $N_s$.

(f) The condition for determining the stopping point, that is, data 18, 19, 20 and 21 are established to the register 17 and the second memory 6.

(g) The operation mode of the first memory 4 is changed to the reading mode, and successive reading of 1024 data at maximum is instructed to determine the stopping point.

(h) The data of the counter 7 are read out as a value $N_p$.

(i) The operation of $(N_p - N_s) \times T$ is performed to obtain a time interval between the starting point and the stopping point.

(j) The obtained time interval is changed to a BCD code and then transfered to the display unit 24.

With reference to FIGS. 4 and 5, the operations of the controller 8 will be described. The signal 214 for presetting the flip-flops 204 and 206 normally assumes the state "0". The signal 203 assumes the logic level of selecting the writing only at the step (a) while the logic level of selecting the reading at other steps. The signal 215 is established to the logic "0" at the step (a) to inhibit the clock pulses 16 but to the logic "1" at other steps to enable the clock pulses 16. At the steps (a), (d) and (g), the preset signal is generated from the pulse generator 202 in response to the rising instant of the signal 201, so that the signal 205 becomes the logic state "1". The flip-flop 206 is set in response to one of clock pulses generated from the oscillator 207 to generate the clock pulses 12 and the memory control signal 10. The above generation of clock pulses is continued until the counter 211 is over-flowed or the coincidence signal 22 is generated. Since the clock pulses 16 are not generated at the step (a), the coincidence signal 22 is not produced. Accordingly, the clock pulses 12 of 1024 are generated.

At the steps (d) and (g), clock pulses 12 of $N_s$ and $N_p$ are generated, respectively, since the signal 22 may be produced in some case. The step (b) shifts a next step when the logic level of the signal 25 changes from the state "1" to the state "0" through the output terminal $PB_0$.

In case of no coincidence signal 22 at the reading for determining the starting pont and the stopping point, the counting value of the counter 7 becomes "1023". In this case, correct time measurement is not carried out. If such information indicative of error is necessary, existence or non-existence of the coincidence signal can be decided by interruption.

Whether or not correct time measuring is performed can be readily known by detecting the above interruption at the step (e) or the step (h).

Figure 6:
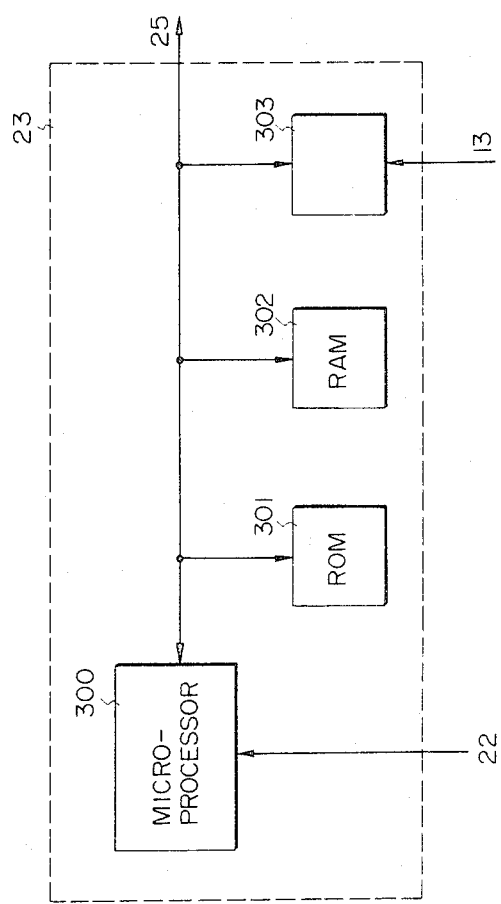
FIG. 6 is a block diagram illustrating an example of the arithmetic unit.

With reference to FIG. 6, the controllable arithmetic unit 23 comprises a microprocessor 300, a read only memory 301 for storing the operation program of the microprocessor 300, a random access memory 302 for storing data necessary for the operation program of the micro processor 300, and an input port 303 for reading-in the contents 13 of the address counter 7.

As has been described in the foregoing, the present invention is capable of measuring the time interval between two desired time points on a digital code train at high speed, and hence is of great utility when employed for waveform analysis and the like.

What we claim is:

1. A time interval measuring system comprising:
    an N-bit input terminal for receiving a series of digital quantities represented by N bits and sampled at equal time intervals;
    a first memory connected to the N-bit input terminal for storing the series of digital quantities;
    at least one N-bit digital comparator means for comparing with each other two digital quantities respectively representing the output from the first memory and a threshold level;
    means for storing the series of digital quantities in the first memory,
    means for reading out the series of digital quantities from the first memory for input to the digital comparator means,
    a second memory formed by an N-bit register having its output connected to the digital comparator means for storing the threshold value, means for storing data in the second memory,
    at least one waveform discriminator connected to the digital comparator means and operative to remove small time deviations in the compared output near the threshold level and to generate a coincidence signal when the number of slopes crossing with the threshold level reaches a predetermined number; and
    means for selecting two different addresses of the first memory when said coincidence signal is generated for a distinct set of the threshold value, the polarity and the number of slopes, and for measuring from a difference between said two addresses of the first memory, at a high speed, a time interval between two digital quantities in the first memory.

2. A time interval measuring system according to claim 1, wherein the waveform discriminator includes at least one exclusive OR gate and at least one counter.

3. A time interval measuring system according to claim 1, wherein the first memory read-out means includes at least one counter.

4. A time interval measuring system according to claim 1, wherein the waveform discriminator is arranged so that the polarity and the number of times of crossing the trigger level can be set as desired.

* * * * *